United States Patent
Daneman et al.

(10) Patent No.: US 10,508,022 B2
(45) Date of Patent: *Dec. 17, 2019

(54) MEMS DEVICE AND PROCESS FOR RF AND LOW RESISTANCE APPLICATIONS

(71) Applicant: INVENSENSE, INC., San Jose, CA (US)

(72) Inventors: Michael J. Daneman, Campbell, CA (US); Martin Lim, San Mateo, CA (US); Xiang Li, Mountain View, CA (US); Li-Wen Hung, Santa Clara, CA (US)

(73) Assignee: INVENSENSE, INC., San Jose, CA (US)

(*) Notice: Subject to any disclaimer, the term of this patent is extended or adjusted under 35 U.S.C. 154(b) by 0 days.

This patent is subject to a terminal disclaimer.

(21) Appl. No.: 15/477,193

(22) Filed: Apr. 3, 2017

(65) Prior Publication Data
US 2017/0297900 A1    Oct. 19, 2017

Related U.S. Application Data

(60) Continuation of application No. 14/800,604, filed on Jul. 15, 2015, now Pat. No. 9,617,141, which is a
(Continued)

(51) Int. Cl.
*B81B 3/00* (2006.01)
*B81C 3/00* (2006.01)

(52) U.S. Cl.
CPC ........... *B81B 3/0086* (2013.01); *B81C 3/001* (2013.01); *B81B 2207/07* (2013.01); *B81C 2201/019* (2013.01)

(58) Field of Classification Search
USPC ........................................................ 257/254
See application file for complete search history.

(56) References Cited

U.S. PATENT DOCUMENTS 3,748,502 A    7/1973   Bernstein
4,556,871 A   12/1985   Yoshikawa et al.
(Continued)

FOREIGN PATENT DOCUMENTS

CN    1848472 A    10/2006
CN    1975956 A    6/2007
(Continued)

OTHER PUBLICATIONS

Wygant, et al., "Integration of 2D CMUT Arrays with Front-End Electronics for Volumetric Ultrasound Imaging," IEEE Transactions on Ultrasonics, Ferroelectrics, And Frequency Control, Feb. 2008, 16 pages, vol. 55 No. 2.
(Continued)

*Primary Examiner* — Timor Karimy
(74) *Attorney, Agent, or Firm* — Amin, Turocy & Watson, LLP

(57) ABSTRACT

MEMS device for low resistance applications are disclosed. In a first aspect, the MEMS device comprises a MEMS wafer including a handle wafer with one or more cavities containing a first surface and a second surface and an insulating layer deposited on the second surface of the handle wafer. The MEMS device also includes a device layer having a third and fourth surface, the third surface bonded to the insulating layer of the second surface of handle wafer; and a metal conductive layer on the fourth surface. The MEMS device also includes CMOS wafer bonded to the MEMS wafer. The CMOS wafer includes at least one metal electrode, such that an electrical connection is formed between the at least one metal electrode and at least a portion of the metal conductive layer.

6 Claims, 9 Drawing Sheets

Related U.S. Application Data division of application No. 13/687,304, filed on Nov. 28, 2012, now Pat. No. 9,114,977.

(56) References Cited

U.S. PATENT DOCUMENTS

| | | | |
|---|---|---|---|
| 5,386,479 | A | 1/1995 | Hersh |
| 5,963,679 | A | 10/1999 | Setlak |
| 7,013,031 | B2 | 3/2006 | Kim et al. |
| 7,053,529 | B2 | 5/2006 | Knowles |
| 7,067,962 | B2 | 6/2006 | Scott |
| 7,109,642 | B2 | 9/2006 | Scott |
| 7,400,750 | B2 | 7/2008 | Nam |
| 7,459,836 | B2 | 12/2008 | Scott |
| 7,489,066 | B2 | 2/2009 | Scott et al. |
| 7,739,912 | B2 | 6/2010 | Schneider et al. |
| 8,139,827 | B2 | 3/2012 | Schneider et al. |
| 8,335,356 | B2 | 12/2012 | Schmitt |
| 8,433,110 | B2 | 4/2013 | Kropp et al. |
| 8,508,103 | B2 | 8/2013 | Schmitt et al. |
| 8,515,135 | B2 | 8/2013 | Clarke et al. |
| 8,666,126 | B2 | 3/2014 | Lee et al. |
| 8,703,040 | B2 | 4/2014 | Liufu et al. |
| 8,723,399 | B2 | 5/2014 | Sammoura et al. |
| 8,805,031 | B2 | 8/2014 | Schmitt |
| 8,913,039 | B2 | 12/2014 | Nikolovski et al. |
| 9,007,348 | B2 | 4/2015 | Nikolovski |
| 9,056,082 | B2 | 6/2015 | Liautaud et al. |
| 9,114,977 | B2 | 8/2015 | Daneman et al. |
| 9,182,853 | B2 | 11/2015 | Wennemer et al. |
| 9,342,187 | B2 | 5/2016 | Jakobsen et al. |
| 9,909,225 | B2 | 3/2018 | Lee et al. |
| 2001/0022488 | A1 | 9/2001 | Kawauchi et al. |
| 2004/0094815 | A1 | 5/2004 | Park et al. |
| 2004/0251781 | A1 | 12/2004 | Bouche et al. |
| 2005/0146401 | A1 | 7/2005 | Tilmans et al. |
| 2006/0012583 | A1 | 1/2006 | Knowles et al. |
| 2007/0230754 | A1 | 3/2007 | Jain et al. |
| 2007/0096300 | A1* | 5/2007 | Wang .................. B81B 3/0072 257/709 |
| 2007/0096605 | A1 | 5/2007 | Fujii et al. |
| 2008/0198145 | A1 | 8/2008 | Knowles et al. |
| 2008/0296708 | A1 | 12/2008 | Wodnicki et al. |
| 2009/0274343 | A1 | 11/2009 | Clarke |
| 2010/0251824 | A1 | 6/2010 | Schneider et al. |
| 2010/0239751 | A1 | 9/2010 | Regniere |
| 2010/0256498 | A1 | 10/2010 | Tanaka |
| 2011/0049652 | A1 | 3/2011 | Wu et al. |
| 2011/0210554 | A1 | 9/2011 | Boysel |
| 2011/0285244 | A1 | 11/2011 | Lewis et al. |
| 2012/0016604 | A1 | 1/2012 | Irving et al. |
| 2012/0049299 | A1* | 3/2012 | Chou .................. B81C 1/00246 257/417 |
| 2012/0074554 | A1* | 3/2012 | Cheng .................. B81C 1/00269 257/684 |
| 2012/0092026 | A1 | 4/2012 | Liautaud et al. |
| 2012/0147698 | A1 | 6/2012 | Wong et al. |
| 2012/0167823 | A1 | 7/2012 | Gardner et al. |
| 2012/0279865 | A1 | 11/2012 | Regniere et al. |
| 2012/0288641 | A1 | 11/2012 | Diatezua et al. |
| 2012/0319220 | A1 | 12/2012 | Noda et al. |
| 2013/0032906 | A1* | 2/2013 | Ogawa ............... B81C 1/00658 257/420 |
| 2013/0099355 | A1* | 4/2013 | Liu ........................ H01G 5/16 257/532 |
| 2013/0127592 | A1 | 5/2013 | Fyke et al. |
| 2013/0133428 | A1 | 5/2013 | Lee et al. |
| 2013/0201134 | A1 | 8/2013 | Schneider et al. |
| 2013/0210175 | A1 | 8/2013 | Hoisington et al. |
| 2014/0145244 | A1 | 5/2014 | Daneman et al. |
| 2014/0176332 | A1 | 6/2014 | Alameh et al. |
| 2014/0219063 | A1 | 8/2014 | Hajati et al. |
| 2014/0219521 | A1 | 8/2014 | Schmitt et al. |
| 2014/0355387 | A1 | 12/2014 | Kitchens, II et al. |
| 2015/0035375 | A1 | 2/2015 | Mayer et al. |
| 2015/0036065 | A1 | 2/2015 | Yousefpor et al. |
| 2015/0076963 | A1 | 3/2015 | Sipp |
| 2015/0169136 | A1 | 6/2015 | Ganti et al. |
| 2015/0189136 | A1 | 7/2015 | Chung et al. |
| 2015/0220767 | A1 | 8/2015 | Yoon et al. |
| 2015/0261261 | A1 | 9/2015 | Bhagavatula et al. |
| 2015/0286312 | A1 | 10/2015 | Kang et al. |
| 2015/0298965 | A1 | 10/2015 | Tsai et al. |
| 2016/0031702 | A1 | 2/2016 | Daneman et al. |
| 2016/0117541 | A1 | 4/2016 | Lu et al. |

FOREIGN PATENT DOCUMENTS

| | | |
|---|---|---|
| CN | 101375236 | 2/2009 |
| CN | 101578573 | 11/2009 |
| CN | 102590555 A | 7/2012 |
| CN | 103026520 A | 4/2013 |
| EP | 1533743 A1 | 5/2005 |
| KR | 20090010357 A | 1/2009 |
| WO | 2009137106 A2 | 11/2009 |
| WO | 2015009635 A1 | 1/2015 |
| WO | 2015112453 A1 | 7/2015 |
| WO | 2015120132 A1 | 8/2015 |
| WO | 2015131083 A1 | 9/2015 |

OTHER PUBLICATIONS

Fesenko, "Capacitive Micromachined Ultrasonic Transducer (cMUT) for Biometric Applications," Thesis for the Degree of Erasmus Mundus Master of Nanoscience and Nanotechnology, 2012, 46 pages, Goteborg, Sweden.

Vanagas, et al., "Study of the CMUT Operation in Microfluidic Application," Paper 10: 344—2012 IEEE International Ultrasonics Symposium. Last accessed Jun. 26, 2014, 4 pages.

Feng, et al., "Touch Panel with Integrated Fingerprint Sensors Based User Identity Management," Last accessed Jul. 20, 2014, 7 pages.

Singh, "Fingerprint Sensing Techniques, Devices and Applications," Apr. 2003, 31 pages.

"Capacitive Micromachined Ultrasonic Transducers," Wikipedia, Last accessed Jun. 25, 2014, 4 pages.

Schmitt, et al., "Surface Acoustic Impediography: A New Technology for Fingerprint Mapping and Biometric Identification: A Numerical Study," Proc. SPIE 5403, Sensors, and Command, Control, Communications, and Intelligence (C3I) Technologies for Homeland Security and Homeland Defense III, 309, Sep. 15, 2004, 2 pages.

"General Description and Advantages of CMUTs". Last accessed Jun. 26, 2014, 5 pages.

Office Action dated Jan. 30, 2014 for U.S. Appl. No. 13/687,304, 15 pages.

Office Action dated May 28, 2014 for U.S. Appl. No. 13/687,304, 13 pages.

Office Action dated Sep. 16, 2014 for U.S. Appl. No. 13/687,304, 11 pages.

Office Action dated Oct. 20, 2015 for U.S. Appl. No. 14/480,051, 25 pages.

Khuri-Yakub, et al. "Next-gen ultrasound ," IEEE Spectrum, vol. 46, No. 5, pp. 44-54, May 2009.

Lamberti, et al. "A high frequency cMUT probe for ultrasound imaging of fingerprints," Sensors and Actuators A: Physical 172 (2), pp. 561-569. 2011.

Iula, et al. "Capacitive Microfabricated Ultrasonic Transducers for Biometric Applications"; Microelectronic Engineering, vol. 88, Issue 8, 2011, pp. 2278-2280.

Tang, et al. "Pulse-Echo Ultrasonic Fingerprint Sensor on A Chip," University of California, Berkeley, CA, USA, 2013.

Lu, et al. "High frequency piezoelectric micromachined ultrasonic transducer array for intravascular ultrasound imaging." Micro Electro Mechanical Systems (MEMS), 2014 IEEE 27th International Conference on. IEEE, 2014.

Olsson, III, et al. "Post-CMOS-Compatible Aluminum Nitride Resonant MEMS Accelerometers." Journal of Microelectromechanical Systems, vol. 18, No. 3, Jun. 2009.

(56) References Cited

OTHER PUBLICATIONS

Wojciechowski, et al. "Single-chip precision oscillators based on multi-frequency, high-Q aluminum nitride MEMS resonators." Solid-State Sensors, Actuators and Microsystems Conference, 2009. TRANSDUCERS 2009. International. IEEE, 2009.
International Search Report and Written Opinion dated Nov. 2, 2015 for PCT Application Serial No. PCT/US2015/043329, 12 pages.
Taiwanese Office Action dated Dec. 8, 2015 for Taiwanese Patent Application Serial No. 103132242, 6 pages.
Partial International Search Report dated Jan. 4, 2016 for PCT Application Serial No. PCT/US2015/048964, 7 pages.
"Savoia et al. ""Design and Fabrication of a cMUT Probe for Ultrasound Imaging of Fingerprints"" 2010 IEEE International Ultrasonics Symposium Proceedings; Publication [online] Oct. 2010 [retrieved Oct. 7, 2014] Retrieved from Internet: <hUp://ieeexplore.ieee.org/xpl/login.jsp?tp=&arnumber=5935836>; pp. 1877-1880".
"Dausch et al. ""Theory and Operation of 2-D Array Piezoelectric Micromachined Ultrasound Transducers"" IEEE Transactions on Ultrasonics, Ferroelectrics, and Frequency Control, vol. 55, No. 11, Nov. 2008; Retrieved fromnternet on [Dec. 9, 2014]: <https:llrti.org/pubs/dauschtuffcv55isll p2484nov2008.pdf>".
"Qiu et al. ""Piezoelectric Micromachined Ultrasound Transducer (PMUT) Arrays for Integrated Sensing, Actuation and Imaging"""; Sensors 2015, 15, 8020-8041; doi: 1 0.3390/s150408020; Retrieved from Internet [Dec. 9, 2015] : <http://NWW.mdpi.com/1424-8220/15/4/8020/pdf>".
Chinese Office Action dated Feb. 3, 2016 for Chinese Application Serial No. 201410483646.X, 12 pages.
International Search Report and Written Opinion dated Mar. 14, 2016 for PCT Application Serial No. PCT/US2015/048964, 16 pages.
Office Action dated Apr. 14, 2016 for U.S. Appl. No. 14/480,051, 29 pages.
Office Action dated Aug. 15, 2016 for U.S. Appl. No. 14/453,326, 57 pages.
Office Action dated Sep. 28, 2016 for U.S. Appl. No. 14/829,404, 50 pages.
Chinese Office Action dated Aug. 1, 2016 for Chinese Application Serial No. 201410483646.X, 4 pages.
Office Action dated Jan. 8, 2016 for U.S. Appl. No. 14/800,604, 18 pages.
Final Office Action dated Jul. 6, 2016 for U.S. Appl. No. 14/800,604, 11 pages.
Office Action dated Apr. 3, 2017 for U.S. Appl. No. 15/291,599, 33 pages.
Office Action dated Apr. 12, 2017 for U.S. Appl. No. 14/829,404, 26 pages.
Office Action dated Jul. 10, 2017 for U.S. Appl. No. 15/291,599, 14 pages.
Office Action dated Sep. 8, 2017 for U.S. Appl. No. 15/477,202, 33 pages.
Office Action dated Nov. 16, 2017 for U.S. Appl. No. 15/291,599, 16 pages.
Office Action dated Dec. 15, 2017 for U.S. Appl. No. 15/367,766, 46 pages.
Office Action dated Dec. 22, 2017 for U.S. Appl. No. 14/829,404, 24 pages.
Office Action dated Jan. 29, 2015 for U.S. Appl. No. 13/687,304, 11 pages.
Office Action dated Apr. 6, 2018 for U.S. Appl. No. 14/829,404, 20 pages.
Office Action dated Mar. 5, 2018 for U.S. Appl. No. 15/477,202, 14 pages.
Office Action dated Jun. 7, 2018 for U.S. Appl. No. 15/291,599, 18 pages.
Office Action dated Jul. 10, 2018 for U.S. Appl. No. 15/367,766, 21 pages.
Office Action dated Sep. 20, 2018 for U.S. Appl. No. 14/829,404, 26 pages.
MICROFAB, "CMUT Working Principle", 2014, 2 pages.
Non-Final Office Action received for U.S. Appl. No. 15/367,766 dated Feb. 8, 2019, 21 pages.
Non-Final Office Action received for U.S. Appl. No. 14/829,404 dated Apr. 3, 2019, 24 pages.
Chinese Office Action and Search Report for Chinese Application Serial No. 201580054319.5 dated Feb. 27, 2019, 26 pages.
Official Communication for European Patent Application No. 15 767 646.1-1207 dated Feb. 26, 2019, 11pgs.
Tsai et al., "Versatile CMOS-Mems integrated piezoelectric platform" 2015 Transducers—2015 18th International Conference on Solid-State Sensors, Actuators and Microsystems (Transducers), IEEE, Jun. 21, 2015 (Jun. 21, 2015), pp. 2248-2251, XP033189793 DOI: 10.1109/TRANSDUCERS.2015.7181409.
Notice of Allowance for U.S. Appl. No. 14/829,404 dated Jul. 17, 2019, 32 pages.

\* cited by examiner

MEMS DEVICE AND PROCESS FOR RF AND LOW RESISTANCE APPLICATIONS

CROSS-REFERENCE TO RELATED APPLICATION

Under 35 U.S.C. 120, this application is a Continuation Application, and claims priority to each of, U.S. patent application Ser. No. 14/800,604, filed on Jul. 15, 2015, entitled "MEMS DEVICE AND PROCESS FOR RF AND LOW RESISTANCE APPLICATIONS," which is a divisional of U.S. patent application Ser. No. 13/687,304, filed on Nov. 28, 2012 (now U.S. Pat. No. 9,114,977), entitled "MEMS DEVICE AND PROCESS FOR RF AND LOW RESISTANCE APPLICATIONS." The entireties of the foregoing applications are hereby incorporated by reference herein.

FIELD OF THE INVENTION

The present invention relates to Microelectromechanical Systems (MEMS) devices, and more particularly, to MEMS devices for Radio Frequency (RF) and low resistance applications.

BACKGROUND

MEMS devices comprise a moveable microstructure that moves in response to forces such as inertial, electrostatic, magnetic or differential pressure for applications requiring low resistance. There is a strong need for a cost-effective solution that can be utilized in low resistance applications. The present invention addresses such a need.

SUMMARY

MEMS device for low resistance applications are disclosed. In a first aspect, the MEMS device comprises a MEMS wafer including a handle wafer with one or more cavities containing a first surface and a second surface and an insulating layer deposited on the second surface of the handle wafer. The MEMS device also includes a device layer having a third and fourth surface, the third surface bonded to the insulating layer of the second surface of the handle wafer; and a metal conductive layer on the fourth surface. The MEMS device also includes a CMOS wafer bonded to the MEMS wafer. The CMOS wafer includes at least one metal electrode, such that an electrical connection is formed between the at least one metal electrode and at least a portion of the metal conductive layer.

In a second aspect, a MEMS device comprises a MEMS substrate comprising a moveable portion and one or more stand-offs protruding from the substrate; an aluminum layer deposited onto the one or more stand-offs. The MEMS substrate includes an electrically conductive diffusion barrier layer disposed on top of the aluminum layer; and a germanium layer disposed on top of the electrically conductive diffusion barrier layer. The MEMS device further includes a CMOS substrate coupled to the MEMS substrate containing at least one electrode and one or more aluminum pads. The one or more stand-offs is bonded the one or more aluminum pads utilizing an aluminum-germanium solder between the one or more aluminum pads and the germanium layer.

In a third aspect, a device comprises a first substrate with a MEMS device. The MEMS device includes a silicon movable element and a piezoelectric element such that a strain is induced on the piezoelectric element when an electric potential is applied. The device also includes a second substrate with at least one electronic circuit and electrical connections provided by bonding of the first substrate to the second substrate. The electrical connections from the MEMS device to the electronic circuit provide the electrical potential to the piezoelectric element.

DETAILED DESCRIPTION

The present invention relates to Microelectromechanical Systems (MEMS) devices, and more particularly, to MEMS devices for Radio Frequency (RF) and low resistance applications. The following description is presented to enable one of ordinary skill in the art to make and use the invention and is provided in the context of a patent application and its requirements. Various modifications to the described embodiments and the generic principles and features described herein will be readily apparent to those skilled in the art. Thus, the present invention is not intended to be limited to the embodiments shown, but is to be accorded the widest scope consistent with the principles and features described herein.

In the described embodiments Micro-Electro-Mechanical Systems (MEMS) refers to a class of structures or devices fabricated using semiconductor-like processes and exhibiting mechanical characteristics such as the ability to move or deform. MEMS often, but not always, interact with electrical signals. MEMS devices include but are not limited to gyroscopes, accelerometers, magnetometers, pressure sensors, and radio-frequency components. Silicon wafers containing MEMS structures are referred to as MEMS wafers.

In the described embodiments, MEMS device may refer to a semiconductor device implemented as a micro-electro-mechanical system. MEMS structure may refer to any feature that may be part of a larger MEMS device. An engineered silicon-on-insulator (ESOI) wafer may refer to a SOI wafer with cavities beneath the silicon device layer or substrate. Handle wafer typically refers to a thicker substrate used as a carrier for the thinner silicon device substrate in a silicon-on-insulator wafer. Handle substrate and handle wafer can be interchanged.

In the described embodiments, a cavity may refer to an opening or recession in a substrate wafer and enclosure may refer to a fully enclosed space. Bond chamber may be an enclosure in a piece of bonding equipment where the wafer bonding process takes place. The atmosphere in the bond chamber determines the atmosphere sealed in the bonded wafers.

Additionally, a system and method in accordance with the present invention describes a class of RF MEMS devices, sensors, and actuators including but not limited to switches, resonators and tunable capacitors that are hermetically sealed and bonded to integrated circuits that may use capacitive sensing and electrostatic, magnetic, or piezo-electric actuation.

Figure 1A:
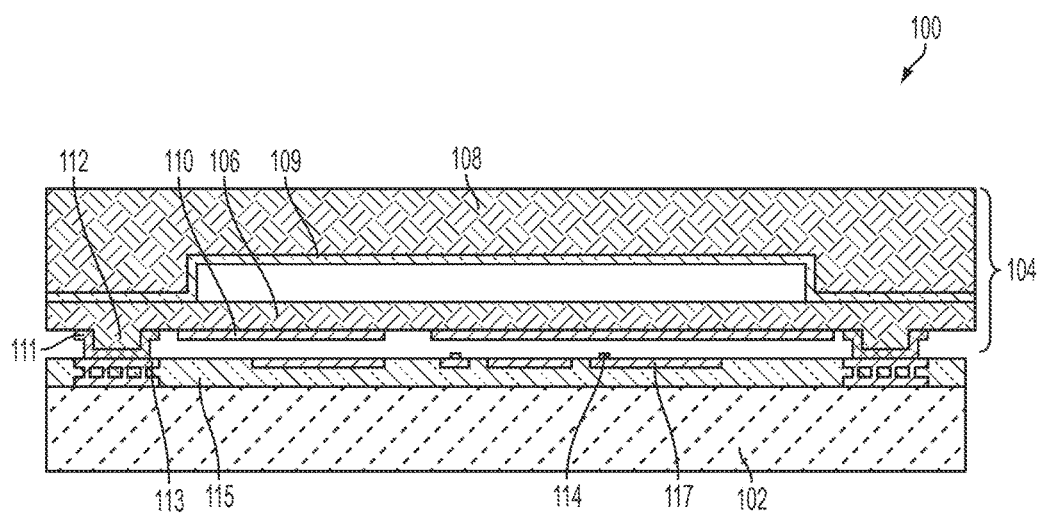
FIG. 1A illustrates a cross-section view of a MEMS structure in accordance with a first embodiment.

FIG. 1A illustrates a cross-section view of a MEMS structure 100 in accordance with a first embodiment. FIG. 1A shows a MEMS structure with addition of metal on the silicon structural layer. The structure includes a CMOS wafer 102 bonded to a MEMS wafer 104. The MEMS wafer 104 comprises a silicon device layer 106 fusion bonded to a handle wafer 108 through an oxide layer 109. A MEMS aluminum 110 metal layer is added to the silicon device layer 106. Adding a metal layer lowers the resistivity of the MEMS structure over that of just the silicon device layer 106 making it more attractive for application requiring low resistance (ex. RF MEMS, Lorentz force sensors, etc). In this embodiment, the connection between CMOS wafer 102 and MEMS wafer 104 is created through the silicon stand-offs 112 using an aluminum-germanium eutectic bond formed by germanium 111 and aluminum 113. Apart from the stand-offs 112 the bulk of the current is carried by the metal layers 117. In an embodiment, spacers 114 composed of an insulating material such as Silicon Oxide or Silicon Nitride may be placed on bottom metal layer 117 to reduce stiction and control the gap between the top metal layer 110 and the bottom metal layer 117.

Figure 1B:
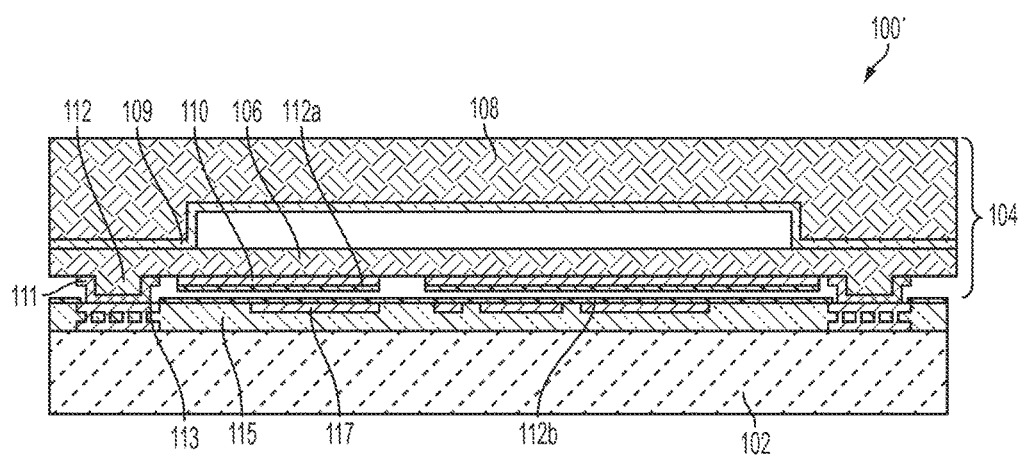
FIG. 1B illustrates a cross-section view of a MEMS structure in accordance with a second embodiment.

FIG. 1B illustrates a cross-section view of a MEMS structure 100' in accordance with a second embodiment. FIG. 1B shows a MEMS structure with additional insulating layer 112a deposited onto the MEMS aluminum 110 and insulating layer 112b deposited onto the bottom electrode 117 to prevent shorting and create a well-defined capacitive gap when the moveable MEMS structure consisting of the silicon device layer 106, MEMS aluminum 110, and insulating layer 112a are brought into contact with the electrodes on the CMOS wafer 102.

Figure 2:
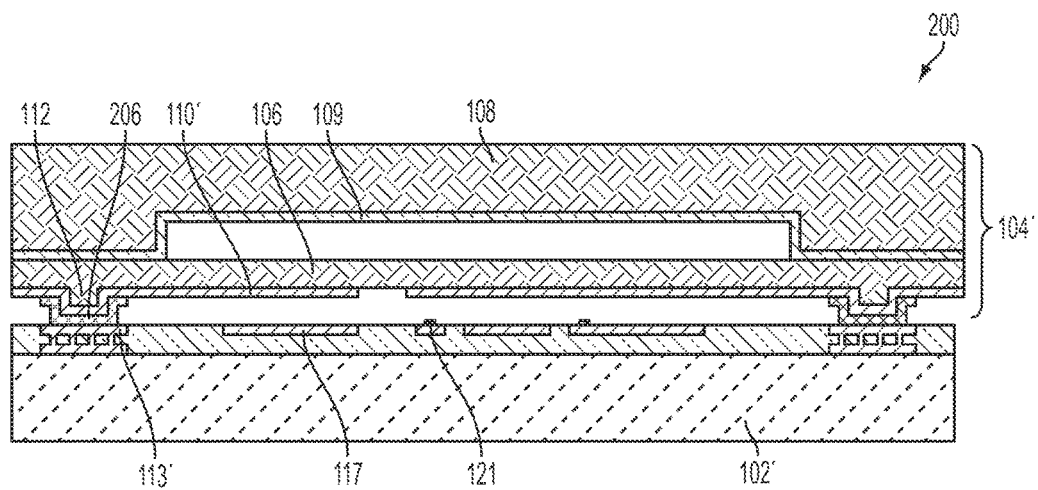
FIG. 2 illustrates a cross-section view of a MEMS structure in accordance with a third embodiment.

FIG. 2 illustrates a cross-section view of a MEMS structure 200 in accordance with a third embodiment. FIG. 2 shows a MEMS structure similar to FIG. 1A. However, in this embodiment the electrical connection between the CMOS wafer 102' and the MEMS wafer 104' occurs through physical contact between the CMOS aluminum 204 on the CMOS wafer 102' and the MEMS aluminum 110' on the MEMS wafer 104' connected by an Aluminum-Germanium layer created by the eutectic reaction between germanium 206 and CMOS aluminum 113' on the CMOS wafer 102' and the MEMS aluminum, 110' on the MEMS wafer 104'. One possible risk of this embodiment is a preferential reaction of the germanium 206 with the MEMS aluminum 110' (since that is the layer it is directly deposited on) with a possibly insufficient reaction with the CMOS aluminum 113'. The insufficient reaction may lead to poor bonds and marginal electrical connections.

Figure 3:
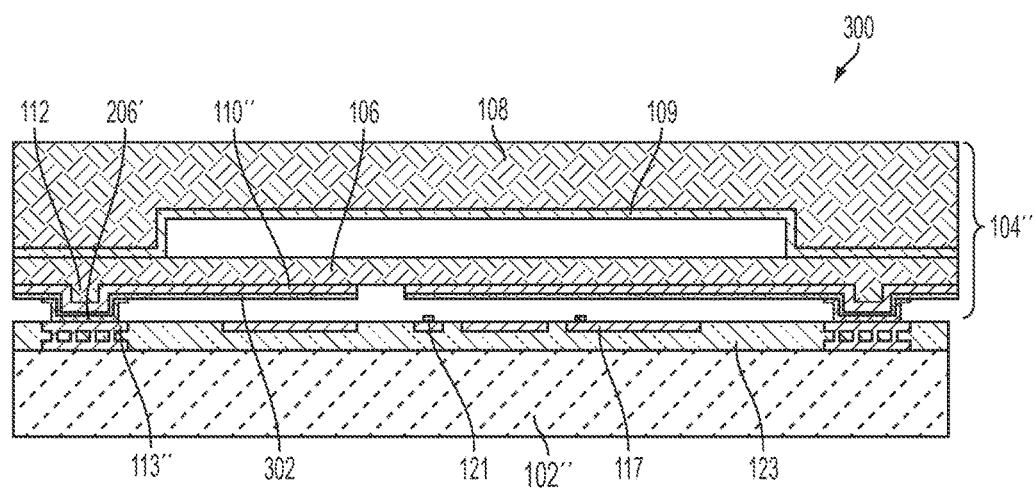
FIG. 3 illustrates a cross-section view of a MEMS structure in accordance with a fourth embodiment.

FIG. 3 illustrates a cross-section view of a MEMS structure 300 in accordance with a fourth embodiment. FIG. 3 shows a MEMS structure identical to FIG. 2 with the exception of a barrier layer 302 deposited between the MEMS aluminum 110" and germanium 206'. The barrier layer 302 is electrically conductive and makes an electrical contact with aluminum upon physical contact. The objective of the barrier layer 302 is to prevent a eutectic reaction between the MEMS aluminum 110" and germanium 206', leaving germanium 206' to eutectically react with the CMOS aluminum 113". One such barrier layer may be Titanium Nitride. During the eutectic reaction, the CMOS aluminum 113" will mix with germanium 206' creating an electrical contact and physical bond to the barrier layer 302 on the MEMS aluminum 110", thereby creating an electrical contact between the CMOS wafer 102" and MEMS wafer 104".

Figure 4:
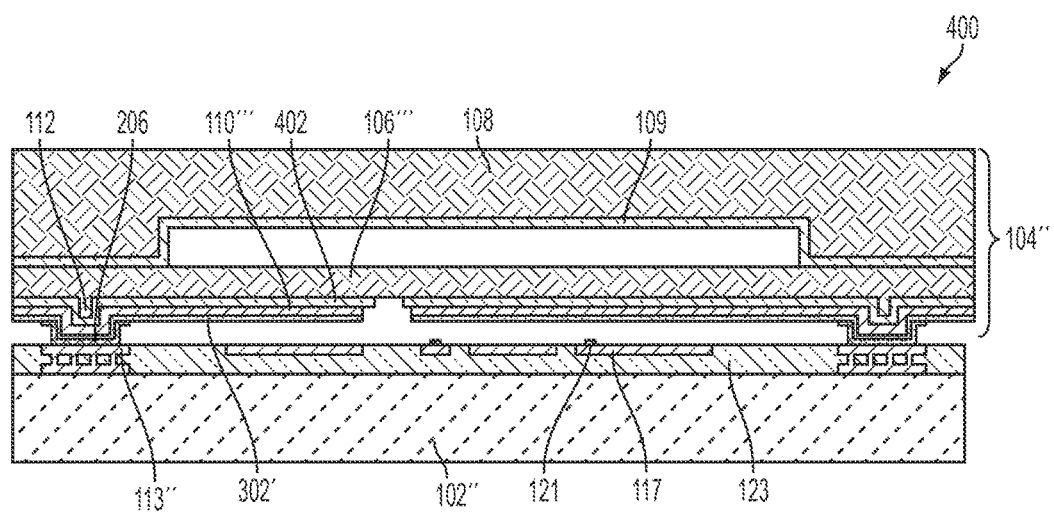
FIG. 4 illustrates a cross-section view of a MEMS structure in accordance with a fifth embodiment.

FIG. 4 illustrates a cross-section view of a MEMS structure 400 in accordance with a fifth embodiment. FIG. 4 shows a MEMS structure identical to FIG. 3, but with an insulating layer 402 deposited between the MEMS aluminum 110''' and silicon device layer 106''' thereby electrically insulating the silicon from the metal. The insulating layer 402 is needed in cases where it is not desirable to carry any electrical signal in the silicon layer (for example in RF applications where signal transmission in the silicon would produce a power loss). In this embodiment, at RF frequencies the MEMS aluminum 110''' is still capacitively coupled to the silicon device layer 106''' through the insulating layer 402. To achieve sufficient isolation the insulating layer must be sufficiently thick to minimize capacitance or the silicon must be sufficiently resistive so as to minimize electrical signal coupling into it.

Figure 5:
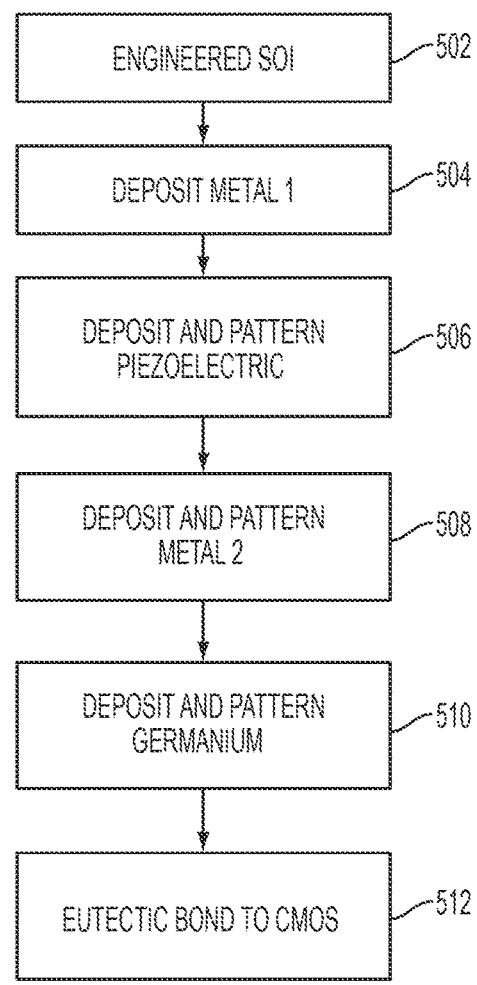
FIG. 5 is a flowchart of a process for adding a piezoelectric layer to a MEMS structure.

FIG. 5 is a flowchart of a process for adding metal and piezoelectric layers to a MEMS structure. The process starts with an Engineered SOI 502. A first metal layer (metal 1) is deposited onto the device silicon surface via step 504 followed by the piezoelectric layer deposition (Ex. Aluminum Nitride or PZT) pattern and etch via step 506. Next a second metal layer (Metal 2) deposited onto the wafer to serve as a top electrode for the piezoelectric layer as well as to provide electrical contact between Metal 1 and the CMOS substrate via step 508. A germanium layer is deposited onto Metal 1 and patterned to define germanium pads in regions where bonding to CMOS will take place via step 510. Next, the MEMS wafer is bonded to a CMOS wafer such that germanium pads eutectically react with aluminum pads on the CMOS creating electrical and physical contact between the CMOS aluminum and MEMS Metal 2 via step 512.

Figure 6:
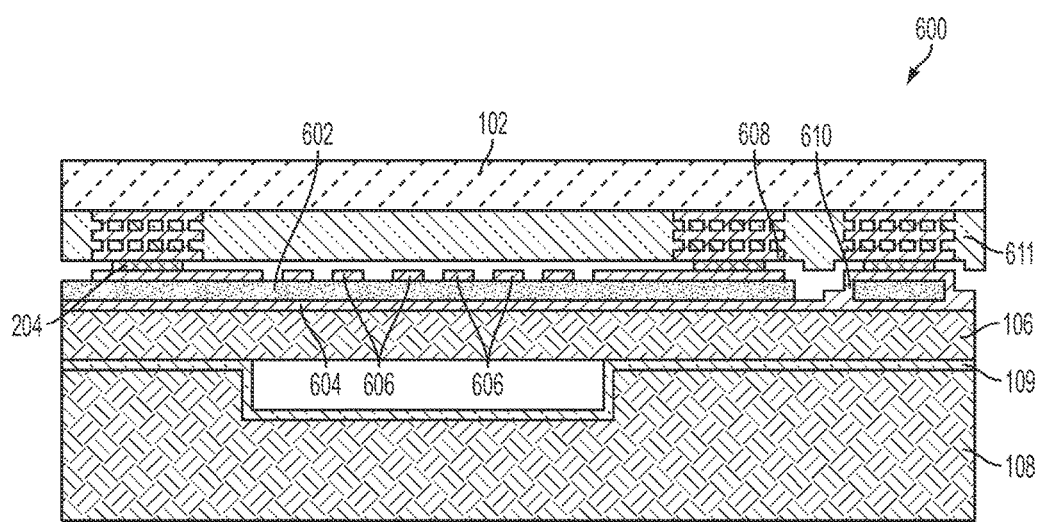
FIG. 6 illustrates a cross-section view of a MEMS structure in accordance with a sixth embodiment.

FIG. 6 illustrates a cross-section view of a MEMS structure 600 in accordance with a sixth embodiment that utilizes a piezoelectric layer. Adding a piezoelectric layer 602 enables a range of applications including acoustic resonators and filters and piezo-actuated devices. To operate, the piezoelectric layer 602 typically requires a bottom electrode 604 and top electrodes 606. The bottom electrode 604 may comprise a first metal layer (metal 1) (Ex. Molybdenum or Platinum). In another embodiment, a silicon device layer can be used as a bottom electrode 604. The top electrode 606 and interconnect 610 are composed of a second metal layer (metal 2) (Ex. Aluminum). The top electrode 606 and interconnect 610 make physical and electrical contact to the CMOS aluminum pads 608 using an Aluminum Germanium bond. The bottom electrode 604 may make physical and electrical contact to the interconnect 610 thereby connecting to the CMOS wafer. Electrical potentials may be applied between top electrodes 606 and the bottom electrode 604 or between individual top electrodes 606. These potentials create electric fields to induce strains within the piezoelectric material.

Figure 7:
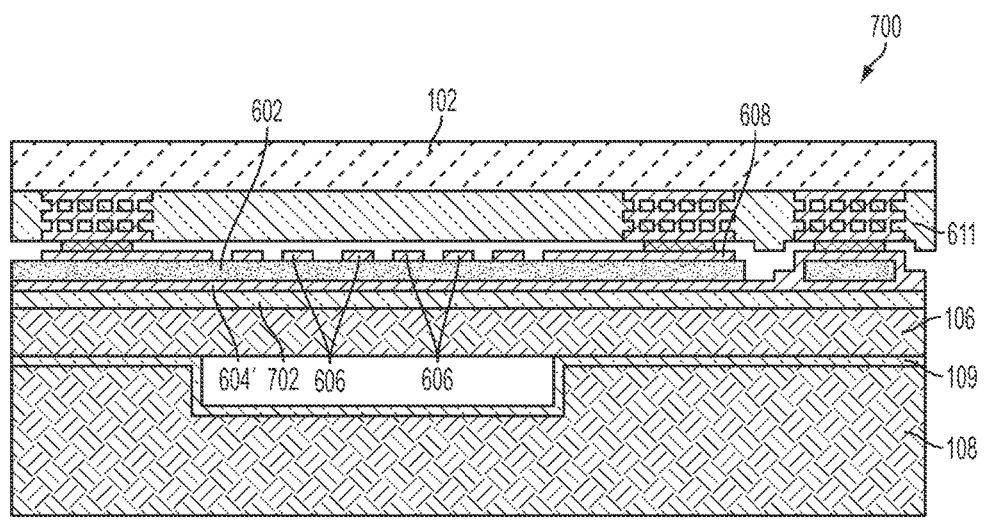
FIG. 7 illustrates a cross-section view of a MEMS structure in accordance with a seventh embodiment.

FIG. 7 illustrates a cross-section view of a MEMS structure 700 in accordance with a seventh embodiment. FIG. 7 shows the same structure as in FIG. 6 with an addition of a silicon dioxide layer 702 between the device layer silicon 106 and metal layer, 604". The silicon dioxide layer, 702 serves as a temperature stabilization layer that improves frequency stability of the resonator or filter over temperature by offsetting the positive Young's modulus temperature coefficient of silicon with the negative Young's modulus temperature coefficient of silicon oxide.

Figure 8:
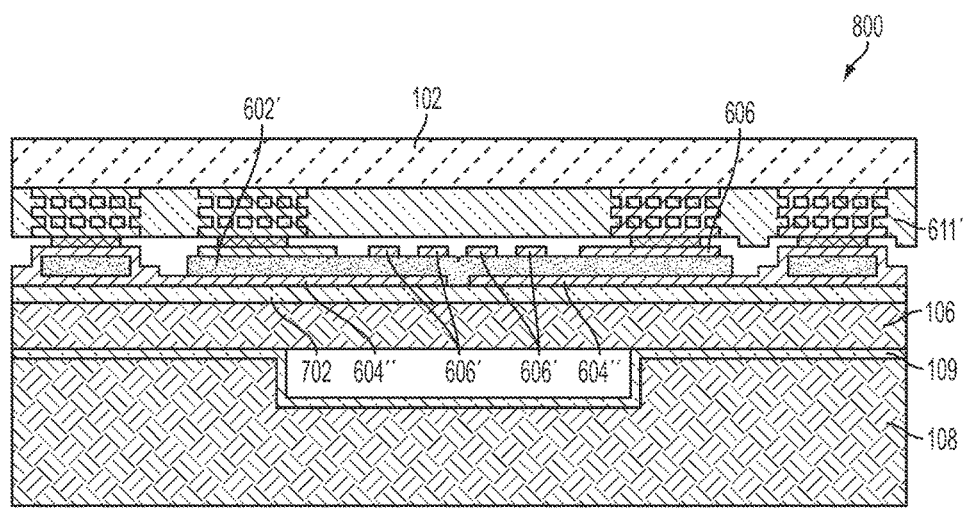
FIG. 8 illustrates a cross-section view of a MEMS structure in accordance with an eighth embodiment.

FIG. 8 illustrates a cross-section view of a MEMS structure 800 in accordance with a eighth embodiment. FIG. 8 shows the same structure as in FIG. 7 with an addition of a patterned bottom electrode 604". By patterning the bottom electrode 604", multiple potentials may be applied to different sections of the bottom surface of the piezoelectric material 602, leading to more design flexibility and potentially more efficient devices. For resonator applications, for example, the ability to input electrical signals on both the bottom and top of the piezoelectric structure can lead to higher coupling efficiency.

Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the present invention.

What is claimed is:

1. A MEMS device comprising:
a MEMS wafer including a handle wafer with a cavity, a silicon device layer that comprises silicon, a first metal conductive layer deposited directly on a surface of the silicon device layer, an electrically conductive barrier layer deposited on the first metal conductive layer, and a bonding layer deposited on the electrically conductive barrier layer, wherein at least a portion of the silicon device layer is located between the first metal conductive layer and the cavity; and
a CMOS wafer bonded to the MEMS wafer, wherein the CMOS wafer includes a second metal conductive layer such that an electrical connection is formed between the CMOS wafer and the MEMS wafer, and wherein the second metal conductive layer of the CMOS wafer mixes with the bonding layer of the MEMS wafer during a eutectic reaction to create an electrical contact to the electrically conductive barrier layer on the first metal conductive layer, wherein the electrically conductive barrier layer prevents a eutectic reaction between the first metal conducive layer and the bonding layer.

2. The MEMS device of claim 1, further comprising:
one or more stand-offs formed from the silicon device layer, wherein the first metal conductive layer extends to cover the one or more of stand-offs.

3. The MEMS device of claim 1, wherein the bonding layer comprises germanium.

4. The MEMs device of claim 1, wherein the electrical connection includes a connection between the bonding layer and the second metal conductive layer.

5. The MEMS device of claim 1, wherein a portion of the silicon device layer is moveable in a vertical direction.

6. The MEMS device of claim 1, wherein the electrically conductive barrier layer comprises titanium nitride.

* * * * *